United States Patent [19]

Uomi et al.

[11] Patent Number: 4,797,891
[45] Date of Patent: Jan. 10, 1989

[54] SEMICONDUCTOR LASER

[75] Inventors: Kazuhisa Uomi, Hachioji; Misuzu Yoshizawa; Yuichi Ono, both of Tokyo; Naoki Chinone, Hachioji; Takashi Kajimura, Nishitama, all of Japan

[73] Assignee: Hitachi, Ltd., Tokyo, Japan

[21] Appl. No.: 941,842

[22] Filed: Dec. 15, 1986

[30] Foreign Application Priority Data

Dec. 20, 1985 [JP] Japan .................... 60-285519

[51] Int. Cl.$^4$ .................................. H01S 3/19
[52] U.S. Cl. ........................ 372/46; 372/45; 372/48; 372/50; 372/97
[58] Field of Search .............. 372/44, 45, 46, 48, 372/23, 97, 108, 50

[56] References Cited

U.S. PATENT DOCUMENTS

| 4,378,255 | 3/1983 | Holonyak, Jr. et al. | 372/45 |
| 4,445,218 | 4/1984 | Coldren | 372/50 |
| 4,674,096 | 6/1987 | Salzman et al. | 372/50 |

FOREIGN PATENT DOCUMENTS 0174839 12/1987 European Pat. Off.

OTHER PUBLICATIONS

IEEE Communications Magazine, vol. 21, No. 6, Sep. 1983, pp. 20–27 IEEE, New York, US: "Semiconductor Optoelectronic Devices for Free-Space Optical Communications".
Optics Letters, vol. 10, No. 4, Apr. 1984, pp. 125–127, Optical Society of America, New York, E. Kapon et al., "Supermode Analysis of Phase-Locked Arrays of Semiconductor Lasers".
IEEE Journal of Quantum Electronics, vol. QE-17, No. 5, May 1981, pp. 718–722, IEEE, New York, K. A. Shore et al., "Near-Field Control in Multistripe Geometry Injection Lasers".
Applied Physics Letters, vol. 33, No. 8, Oct. 15, 1978, pp. 702–704, American Institute of Physics, New York, D. R. Scrifres et al. "Beam Scanning with Twin-Stripe Injection Lasers".
Applied Physics Letters, vol. 41, No. 11, Dec. 1982, pp. 1030–1032, American Institute of Physics, New York; D. R. Scifres et al., "Continuous Wave High-Power, High-Temperature Semiconductor Laser Phase--Locked Arrays".

Primary Examiner—William L. Sikes
Assistant Examiner—Georgia Y. Epps
Attorney, Agent, or Firm—Antonelli, Terry & Wands

[57] ABSTRACT

The present invention relates to phased-array semiconductor lasers having a radiation angle turnable by oscillating independently and stably between the fundamental supermode and the higher order supermode and switching the radiation angles by utilizing the property that their radiation angles are different.

Optical switching and optical scanning, that have been difficult in the prior art, can be made more easily by use of a semiconductor laser having a turnable radiation angle.

The objection of the present invention can be accomplished by disposing separate electrodes at the emission stripes and at the gap between the stripes in the phased-array semiconductor laser.

Further, the present invention may be accomplished by dividing at least one stripe electrode in order to form electrode regions. When the current is applied to all the electrodes, oscillation occurs in the highest order mode and the beam is emitted in another direction. When the current is applied to only the electrode exclusive of the electrode regions, oscillation occurs in the fundamental mode and the beam is emitted in a direction vertical to a facet.

Moreover, the present invention may be accomplished by disposing electrodes outside the stripe regions of the phased-array semiconductor laser so that oscillation occurs in the fundamental supermode when the electric field is applied to the electrodes and in the higher order mode when the electric field is not applied.

22 Claims, 9 Drawing Sheets

SEMICONDUCTOR LASER

BACKGROUND OF THE INVENTION

This invention relates generally to semiconductor lasers and more particularly to a semiconductor laser of the type in which the radiation angle of an emission beam is turnable.

A so-called "phased-array semiconductor laser" which has a large number of multiple emission stripes and generates optical coupling betwen the stripes is a known example of high output semiconductor lasers (Tanetani et al., "32nd Proceeding of Japan Applied Physics Conference", p. 149, No. 1a-ZB-10 (April, 1985)). In this structure, however, a fundamental mode is more difficult to oscillate than a higher order mode as will be described elsewhere. Accordingly, it is known that oscillation occurs in the higher order mode and the radiation beam becomes two or more.

Since the oscillation mode in the phased-array semiconductor lasers is generally referred to as a "supermode", this specification will hereinafter use the same term.

Here, the outline of the supermode will be described, though its detail is described in E. Kapon et al., "OPTICS LETTERS", Vol. 10, No. 4, p. 125 (April, 1984).

Figure 2A:
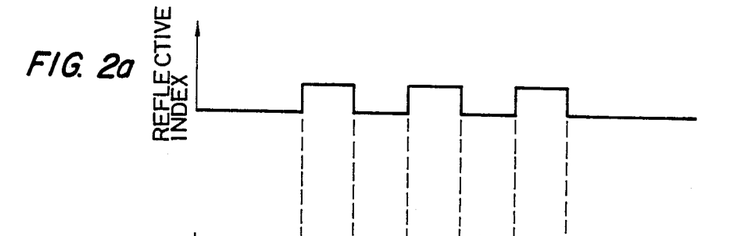
FIGS. 2a, 2b, 2c and 2d are diagrammatic views useful for explaining a supermode.
Figure 2B:
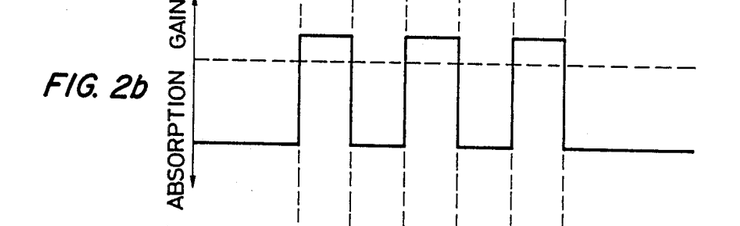
Figure 2C:
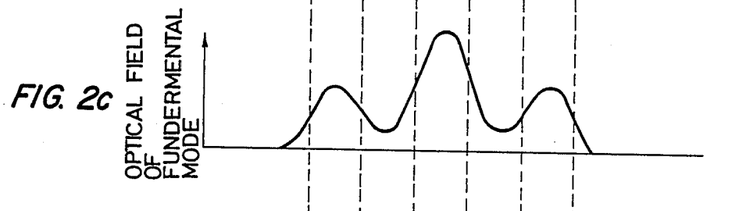
Figure 2D:
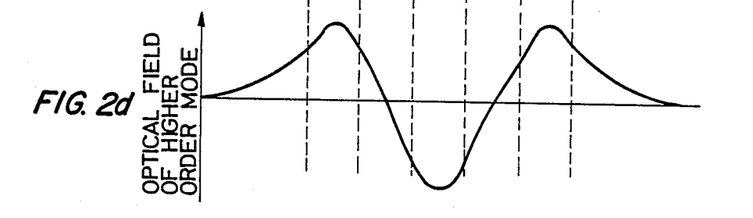

FIGS. 2, 2a, 2b, 2c and 2d of the accompanying drawings shows schematically the relation between the refractive index and gain (absorption) in the phased-array semiconductor laser. In short, an optical gain exists in a region having a large refractive index such as an emission stripe portion and large optical absorption is generated in a region having a small refractive index such as in a gap between the emission stripes. A fundamental mode beam having an optical field such as shown in FIG. 2c has an optical field in a region having large absorption, and since this fundamental mode is absorbed by large absorption in the gap between the stripes, the fundamental mode beam has a large optical loss as a whole and hence, is difficult to oscillate. In other words, its threshold current is great. On the other hand, a higher order mode beam such as shown in FIG. 2d is likely to oscillate because the optical field does not substantially exist in the region having large absorption and no absorption of the optical field is generated in this region.

Figure 1A:
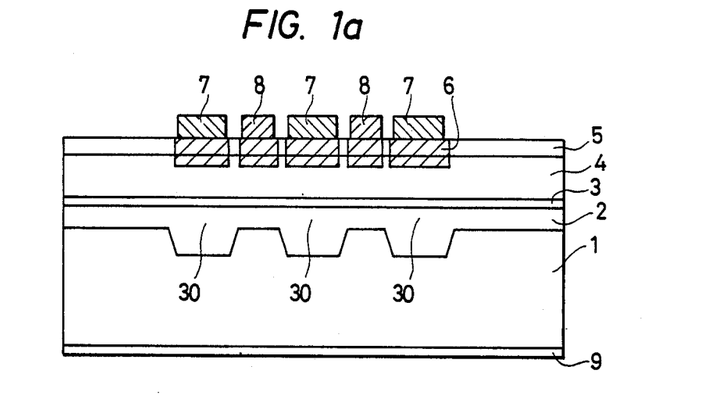
FIGS. 1a and 1b are a sectional view and emission beam distribution diagram of one embodiment of the present invention.
Figure 1B:
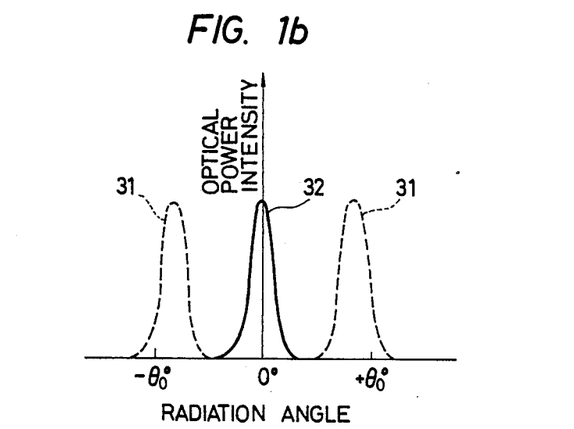

As can be seen from FIG. 2d, the phase of the optical fields of adjacent higher order mode beam are different from each other by 180°, and the emission beam having a radiation angle near 0° offsets with each other and is distinguished so that the emission beam is distributed in a direction of the radiation angle $\theta_o$ (see FIG. 1(b)).

Incidentally, the radiation angle $\theta_o$ is given by the following formula $$\theta_o \approx \mathrm{Sin}^{-1}(\lambda/2S)$$

where S in the gap between the stripes and $\lambda$ is the emission beam wavelength.

The prior art technique described above does not take into consideration any arrangement which makes the radiation angle of the laser beam turnable and the prior art semiconductor lasers are only desgined for high output semiconductor lasers.

In addition, electrodes in the conventional phased-array semiconductor lasers are not separated from one another but are continuous throughout the entire surface.

SUMMARY OF THE INVENTION

The present invention contemplates to have a radiation angle turnable by oscillating independently and stably between the fundamental supermode and the higher order supermode of the phased-array semiconductor lasers and switching the radiation angles by utilizing the property that their radiation angles are different.

Optical switching and optical scanning, that have been difficult in the prior art tehcnique, can be made more easily by use of a semiconductor laser having a turnable radiation angle.

The object of the invention described above can be accomplished by disposing, separate electrodes 7 at the emission stripes and at the gap 8 between the stripes in the phased-array semiconductor laser, as shown in FIG. 1a.

Further, the objection of the present invention may be accomplished by dividing least one stripe electrode in order to form electrode regions 19, as shown in FIG. 5. When a current is applied to all the electrodes, oscillation occurs in the highest order mode and the beam is emitted in the direction of $\theta_o$ described above. On the other hand, when the current is applied to only the electrode 18 exclusive of the electrode regions 19, oscillation occurs in the fundamental mode and the beam is emitted in a direction vertical to a facet.

Figure 9:
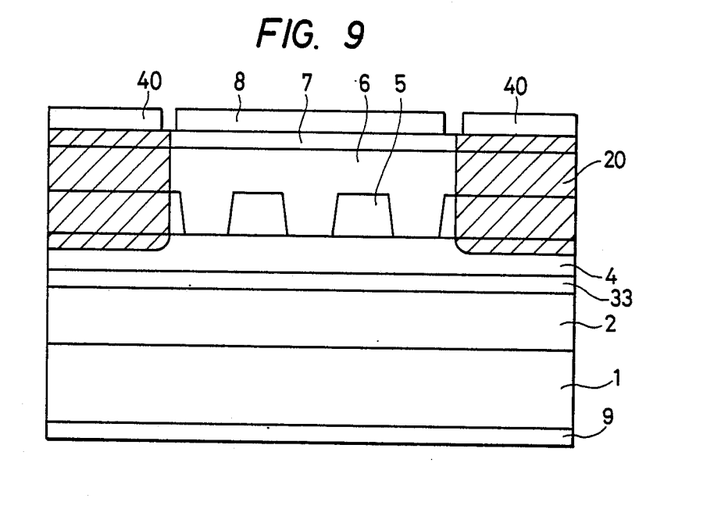
FIG. 9 is a sectional view of a further embodiment of the present invention.

Moreover, the object of the present invention may be accomplished by disposing electrodes 40 outside the stripe regions of the phased-array semiconductor laser as shown in FIG. 9 so that oscillation occurs in the fundamental supermode when the electric field is applied to the electrodes 40 and in the higher order mode when the electric field is not applied.

Figure 5A:
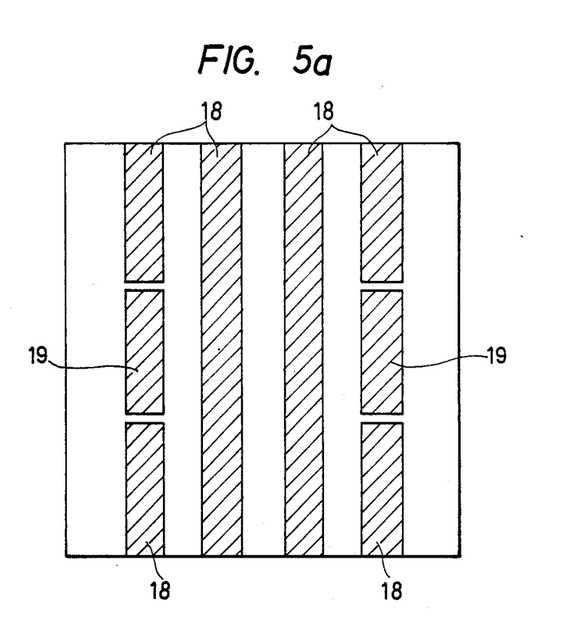
FIGS. 5a and 5b are a sectional view and a emission beam distribution diagram of a further embodiment of the present invention.
Figure 5B:
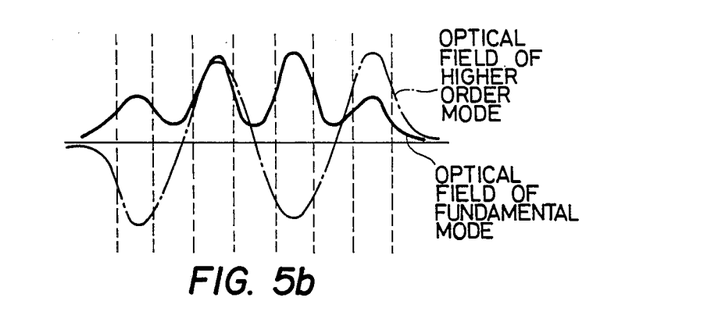

In the devices shown in FIGS. 1a and 5a, the switching speed between the fundamental supermode and the higher order supermode is essentially determined by the relazation oscillation frequency of the semiconductor laser and about 10 GHz is expected. Since switching is made by utilizing absorption in the device of FIG. 9, switching can be made at a higher speed.

When a quantum well structure is used for an active layer, the change of a forbidden band width becomes remarkable due to the field and switching can be made more effectively.

The action of the present invention does not depend upon the number of stripes.

In the FIG. 1 device, when oscillation is caused by applying a voltage to the electrode 7 of the emission stripe region, the mode becomes the highest order mode. Since the phases of the optical field between the stripes in the highest order mode are opposite to one another, the field distribution becomes such as shown in FIG. 2d and the emission beam exhibits a distribution as represented by reference numeral 31 in FIG. 1b and the radiation angles at this time is $+\theta_o$ and $-\theta_o$ (degrees).

When oscillation is caused by injecting a voltage to the electrode 8 between the emission stripe regions, the mode is the fundamental mode and the emission beam exhibits the distribution such as represented by reference numeral 32 in FIG. 1b. The radiation angle at this time is substantially zero (0).

Accordingly, the radiation angle of the emission beam can be made turnable by applying the voltage either to the electrode 7 or to the electrode 8.

The switching speed is essentially determined by the relaxation oscillation frequency of the semiconductor laser, and about 10 GHz can be expected.

In the FIG. 5a device, when the current is injected to all the electrodes, the field distribution of all the stripe regions having a high refractive index becomes great and the mode is the highest order supermode such as shown in FIG. 2d when the current is not injected to the electrode 19, the emission beam undergoes large absorption at the center of the stripe region and the threshold current value of the higher order supermode becomes great so that oscillation occurs in the fundamental supermode. In the fundamental supermode, the phase of the optical field in each stripe region is the same and the beam is emitted in a direction perpendicular to the laser facet.

In the FIG. 9 device, the field distribution of the higher order supermode is penetrated alrgely from the stripe region as shown in FIG. 2d, and the quantity of this penetration is small in the fundamental supermode as shown in FIG. 2c. Therefore, when the electric field is applied to regions other than the stripe region, the forbidden band width of the active layer becomes great due to the Franz-Kerbisch effect, so that the absorption quantity of the emission beam increases and oscillation becomes difficult in the higher order supermode. As a result, oscillation occurs in the fundamental supermode and when the field is not applied, it ossurs inthe higher order supermode. For this reason, the radiation angle of the laser beam can be made turnable in the same way as in the FIGS. 1a, 1b, and 5a, 5b devices.

The present invention can easily provide a semiconductor laser which can easily and stably change the radiation angle of the emission beams. Such a laser can be applied pratically to a scannable light source for use in data processing terminals such as a laser printer, and a novel switchable coupling system of the laser beam in optical communication and optical measurement to an optical fiber and an optical waveguide.

BRIEF DESCRIPTION OF THE DRAWINGS

FIG. 6e is an emission beam distribution diagram for the device of FIG. 6a;

DESCRIPTION OF THE PREFERRED EMBODIMENTS

Embodiment 1:

FIG. 1a is a sectional view of a laser when the present invention is applied ot a GaAlAs system semiconductor laser and FIG. 1b shows the distribution of an emission beam.

Three grooves which is 3 μm wide and 1 μm deep are formed by photoetching on an n-GaAs substrate 1. The gap at the stripe center is 5 μm. Then, an n-$Ga_{0.5}Al_{0.5}As$ cladding layer 2, an undoped $Ga_{0.86}Al_{0.14}As$ active layer 3, a p-$Ga_{0.5}Al_{0.5}As$ cladding layer 4, and n-GaAs layer 5 are sequentially formed by liquid pahse growth. Thereafter, Zn diffusion is made in the stripe form to fabricate a diffusion region 6 which reaches the cladding layer 4. The width of the diffusion region over the groove is smaller by 1 μm than the groove width and the width of the diffusion region over the gap between the grooves is smaller by 0.5 μm than the width of the gap between the grooves. Thereafter, p-electrodes 7, 8 are formed be a lift-off method and after an n-electrode 9 is formed continuously, a laser device having a resonator which is about 300 μm long is obtained by cleaving. When the thickness of the n-$Ga_{0.5}Al_{0.5}As$ cladding layer over the gap between the grooves is from 0.1 to 0.5 μm, the distribution of the refractive indexes is formed such as shown in FIG. 2a.

The laser device thus fabricated oscillates continuously at a current of 100 to 150 mA and a wavelength of 780 nm at room temperature and the oscillation spectrum exhibits a longitudinal single mode. FIG. 1b shows a far-field pattern (the distribution of the emission beam in a direction parallel to a coupling surface). Dash line 31 in FIG. 1b represents the far-field pattern when a current is injected only to the groove region of the high refractive index region through the electrode 7. Two emission beams can be observed at the radiation angles of +4.5° and −4.5° and its full width at half power (FWHM) is 1.5°. This represents that the supermode of the highest order is selected. Solid line 32 in FIG. 1b represents the far-field pattern when the current is injected only to the region between the grooves of the low refractive index region through the electrode 8. The emission beam having one full width at half power is observed at ±0° and this represents that the fundamental supermode is selected. According to this structure, it is clarified that the fundamental supermode and the highest order supermode can be selected independently by current injection. Selection of these supermodes can be made up to optical output of 300 mW.

Figure 3A:
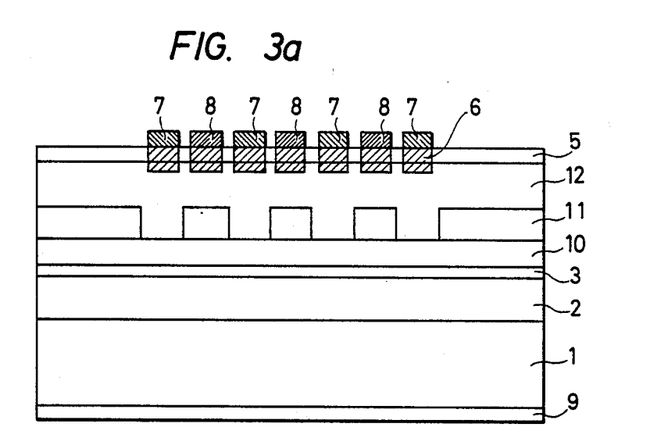
FIGS. 3a, 3b, 4a and 4b are sectional views and reflected index diagrams of a further embodiment of the present invention.
Figure 3B:
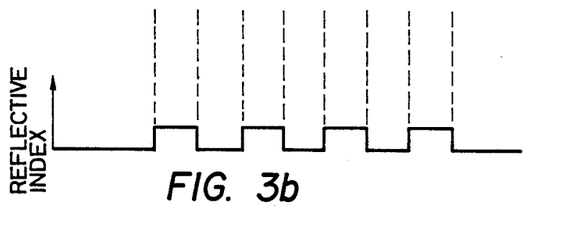

Embodiment 2:

FIG. 3a is a sectional view of a laser in accordance with another embodiment of the present invention and FIG. 3b is a refractive index distribution.

An n-$Ga_{0.5}Al_{0.5}As$ cladding layer 2, an undoped $Ga_{0.86}Al_{0.14}As$ active layer, a p-$Ga_{0.55}Al_{0.45}As$ cladding layer 10 and a p-$Ga_{0.45}Al_{0.55}As$ layer 11 are sequentially formed on an n-GaAs substrate 1 by MOCVD. The $Ga_{0.45}Al_{0.55}As$ layer 11 is removed completely by photoetching to form four groove stripes which are 3 μm wide and expose the surface of the p-$Ga_{0.55}Al_{0.45}As$ cladding layer 10. The gap between the centers of the stripes is 6 μm or the stripe gap is 3 μm. Thereafter, a p-$Ga_{0.55}Al_{0.45}As$ buried layer 12 and an n-GaAs layer 5 are formed by MOCVD. Zn diffusion is then effected in the stripe form to fabricate the diffusion layer 6 reaching the p-$Ga_{0.55}Al_{0.45}As$ layer 12. The width of the diffusion region is 1 μm smaller than the width of the diffusion region over the groove and the width over the gap between the grooves.

Next, p-electrodes 7, 8 are formed by the lift-off method only in each diffusion stripes region and after an n-electrode 9 is formed, a laser device having a resonator which is about 300 μm long is obtained by cleaving. When the p-Ga$_{0.55}$Al$_{0.45}$As cladding layer 10 is 0.05 to 0.6 μm thick, the refractive index distribution such as shown in FIG. 3b can be obtained.

The device thus fabricated causes continuous oscillation at room temperature, a threshold current of from 100 to 160 mA and a wavelength of 780 nm. First of all, current injection is made only to the p-electrode 7 so as to provide only the groove stripes having a high refractive index with the gain, and two emission beams (whose full width at half power is 1.5°) are observed at +4.0° and −4.0° in its far-field pattern. It can be thus confirmed that the supermode of the highest order causes oscillation. On the other hand, when current injection is made only to the p-electrode 8 and the gain is provided only to the groove gap region having a low refractive index, one emission beam can be observed at ±0° in the far-field pattern and the fundamental supermode oscillation can be obtained. In other words, both modes can be selected in a satisfactory manner in the same way as in Embodiment 1 and radiation output of the emission beam of up to 200 mW can be made turnable.

Figure 4A:
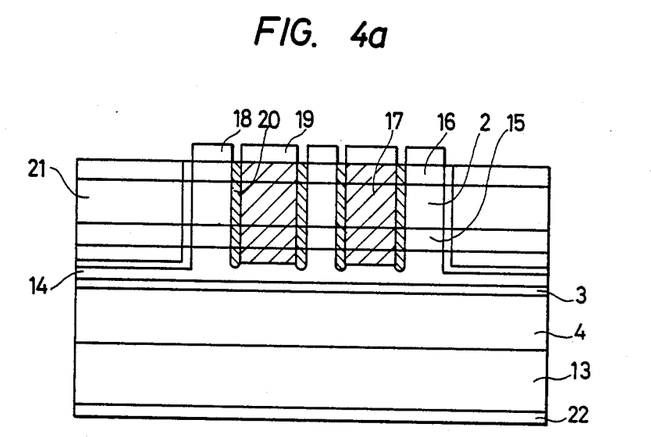
Figure 4B:
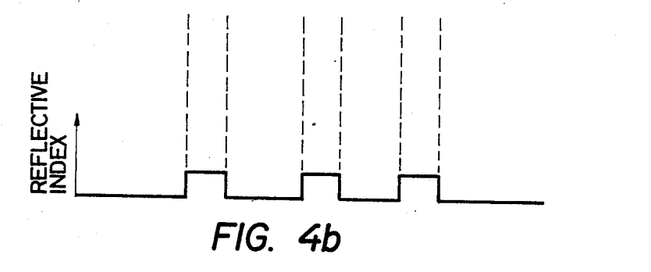

Embodiment 3:

FIG. 4a is a sectional view showing still another embodiment of the present invention, and FIG. 4b is a diagram showing its refractive index distribution.

A p-Ga$_{0.5}$Al$_{0.5}$As cladding layer 4, an undoped Ga$_{0.86}$Al$_{0.14}$As active layer 3, an n-Ga$_{0.55}$Al$_{0.45}$As optical guide layer 14, a superlattice layer 15 formed by alternately laminating 30 layers of 50 Å-thick undoped Ga$_{0.9}$Al$_{0.1}$ well layers and 100 Å-thick updoped Ga$_{0.3}$Al$_{0.7}$As barrier layers, an Ga$_{0.5}$Al$_{0.5}$As cladding layer 2 and an n-GaAs capo layer 16 are sequentially formed by MOCVD (metal organic chemical vapor deposition). Thereafter, Si ion injection 17 is effected into the 3 μm-wide stripe-like regions and the outer region of the phased array region in such a manner as to reach the n-Ga$_{0.55}$Al$_{0.45}$As optical guide layer 14, thereby forming three stripes. The stripe center gap is 7 μm. Thereafter, n-stripe electrodes 18, 19 equipped with 1 μm gaps are formed by the lift-off method. Then, H+ (proton) ion injection is made using the stripe-like n-electrodes 18, 19 as the mask to form an insulation region 20 between each electrode. After a p-electrode 22 is formed, a laser device having a resonator which is about 300 μm long is obtained by cleaving.

In this embodiment, the refractive index of the superlattice layer inside the Si ion injection reigon gets disordered and causes mixing. The refractive index of the disordered superlattice layer is smaller than that of the superlattice layer which is not disordered. As a result, when the n-Ga$_{0.55}$Al$_{0.45}$As optical guide layer 14 is larger than 0.5 μm thick, the refractive index distribution such as shown in FIG. 4b can be formed.

The laser device thus fabricated exhibits the same effect as the devices of Embodiments 1 and 2 and the fundamental supermode and the highest order supermode can be selected independently by causing a current to independently flow through the n-electrodes 18 and 19.

In each of the foregoing embodiments of the present invention, substantially the same effect can be obtained when the number of stripes is from 2 to 20, the strip width is from 1 to 10 μm wide and the stripe gap is from 1 to 8 μm wide in any combination as the stripe structure. A BH (buried hetero) strucuter, a rib type structure, and the like, can be used arbitrarily in addition to the structure described above. Beside Zn described above, it is also possible to use Si and S as the diffusion impurity for insulating the adjacent stripe-like electrodes from one another, and Ga, Al, F and B provide substantially the same effect as the injection ions.

The embodiment can be applied to the beam having a wavelength of from 0.68 to 0.89 μm.

Embodiment 4:

When the same method as in Embodiments 1 through 3 is carried out by replacing the GaAlAs system semiconductor by an InGaAsP system semiconductor in Embodiments 1 through 3, the radiation angle can be made turnable from the emission beam having an emission beam wavelength of from 1.3 to 1.5 μm.

Embodiment 5:

When the same method as in Embodiment 1 through 3 is carried out by replacing the GaAlAs system semiconductor in Embodiments 1 through 3 by an InGaP system semiconductor, the radiation angle can be made turnable for the emission beam having an emission beam wavelength of from 0.58 to 0.7 μm.

Figure 6A:
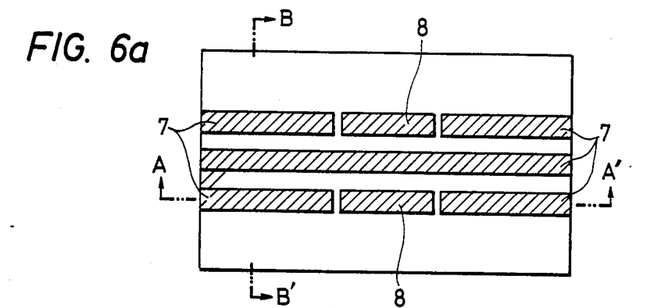
FIGS. 6a, 7a and 8a are top views of a device according to an embodiment of the present invention.
Figure 6B:
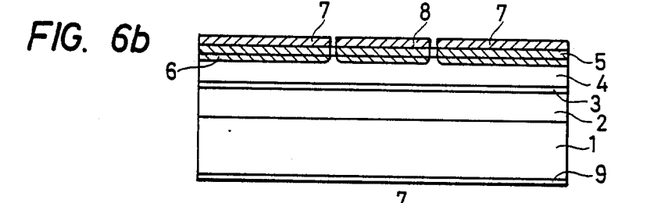
FIGS. 6b, 7b and 8b are sectional views taken along line A—A' of FIGS. 6a, 7a and 8a, respectively.
Figure 6C:
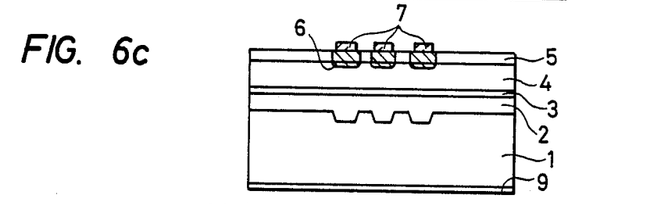
FIGS. 6c, 7c and 8c are sectional veiws taken along line B—B' of FIGS. 6a, 7a and 8a, respectively.
Figure 6D:
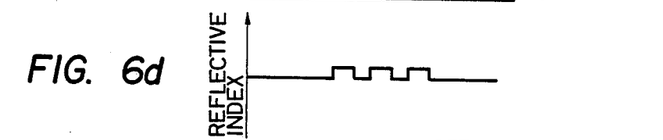
FIGS. 6d, 7d and 8d are diagrams of refractive indexes for the devices of FIGS. 6a, 7a and 8a, respectively.
Figure 6E:
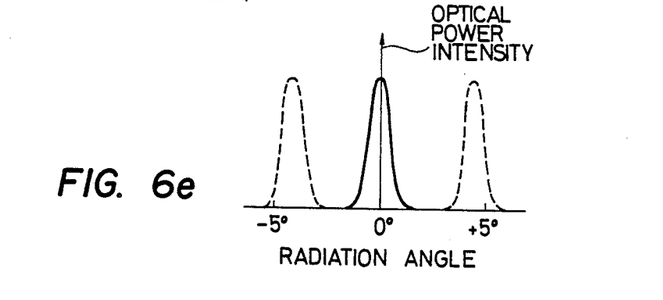

Embodiment 6:

FIG. 6a is a top view when the present invention is applied to a GaAlAs system semiconductor laser, FIG. 6b is a sectional view taken along A—A' and FIG. 6c is a sectional view taken along line B—B' and FIG. 6d is a diagram showing the refractive index distribution on the B—B' section and FIG. 6e is the far-field pattern of the emission beam.

Three grooves which are 3 μm wide and 1 μm deep are formed on the n-Ga As substrate 1 by photoetching. The gap between the stripe centers is 5 μm, or the width of the groove gap is 2 μm. Next, an n-Ga$_{0.5}$Al$_{0.5}$As cladding layer 2, an undoped Ga$_{0.86}$Al$_{0.14}$As active layer 3, a p-Ga$_{0.5}$Al$_{0.5}$As cladding layer 4 and an n-GaAs layer 5 are sequentially formed by liquid phase growth. Zn diffusion is then effected in the stripe form to fabricate a diffusion region 6 which reaches the p-Ga$_{0.5}$Al$_{0.5}$As cladding layer 4. At this time, the width of the diffusion region over the groove is smaller by 1 μm than the groove width and the width of the diffusion region over the gap between the grooves is smaller by 0.5 μm than the width of the groove gap. Thereafter, p-electrodes 7, 8 are formed only in each strip region with diffusion by the lift-off method, and after an n-electrode 9 is formed, a laser device having a resonator length of about 300 μm can be obtained by cleaving. The electrode 8, that is, the length of an independent current injection stripe, is 50 μm. Zn diffusion in the stripe form and the stripe-like electrode thereon can secure insulation between the adjacent electrodes. When the n-Ga$_{0.5}$Al$_{0.5}$As cladding layer is from 0.1 to 0.5 μm thick over the gap between the grooves, a refractive index distribution such as shown in FIG. 6d can be formed.

The device thus fabricated causes continuous oscillation at room temperature, a threshold current of from 100 to 150 mA and a wavelength of 780 nm, and its oscillation spectrum exhibits a single longitudinal mode. FIG. 6e shows its far-field pattern (in a direction parallel to the joint surface). The far-field pattern when the current is injected to the p-electrodes 7 and 8 in order to inject the current to all the stripe regions is represented by dash line in the drawing. Two emission beams are observed at +4.5° and −4.5° and its full width at half power is 1.5°. This represents that the highest order mode is selected. On the other hand, the far-field pattern when the current is injected only to the p-electrode 7 is represented by solid line in the drawing. One emission beam having a full width at half power of 1.5° is observed at ±0° and this represents that the fundamental mode is selected. In other words, it is clarified that the fundamental supermode and the highest order supermode can be selected by current injection. The selection of both supermodes can be made to an optical output of 300 mW.

Figure 7A:
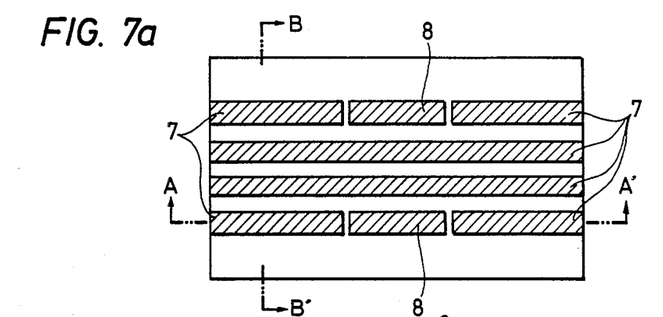
Figure 7B:
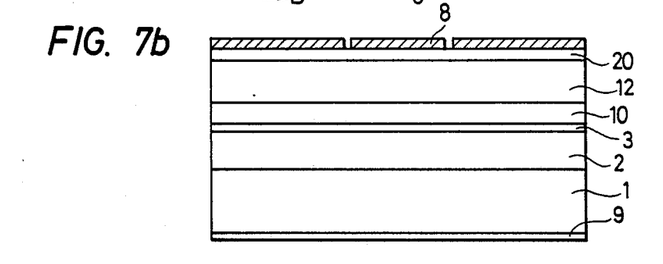
Figure 7C:
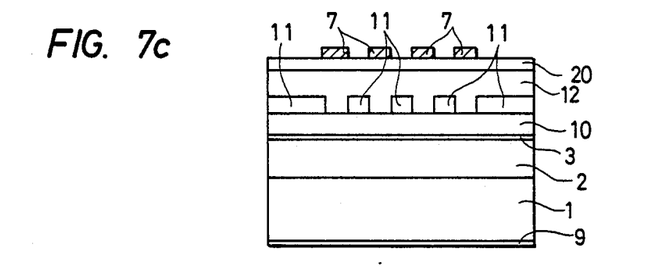
Figure 7D:
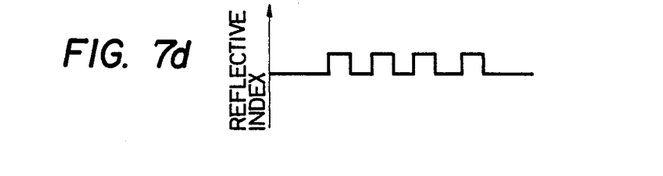

Embodiment 7:

FIGS. 7a through 7c show still another embodiment of the present invention. FIG. 7a is a top view of a laser, FIG. 7b is a sectional view taken along line A—A' and FIG. 7c is a sectional view taken along line B—B' and FIG. 7d is a diagram showing a refractive index distribution.

An n-$Ga_{0.5}Al_{0.5}As$ cladding layer 2, an undoped $Ga_{0.86}Al_{0.14}As$ active layer 3, a p-$Ga_{0.55}Al_{0.45}As$ cladding layer 10 and an n-$Ga_{0.45}Al_{0.55}As$ layer 11 are sequentially formed on an n-GaAs substrate 1 by MOCVD. After the n-$Ga_{0.45}Al_{0.55}As$ layer 11 is removed completely by photoetching, four groove stripes which are 3 μm wide and expose the surface of the p-$Ga_{0.55}Al_{0.45}As$ cladding layer 10 are formed. The spaces of the stripe center to center is 6μm or in other words, the stripe gap is 3 μm. Thereafter, a buried layer 12 by p-$Ga_{0.55}Al_{0.45}As$ and p-GaAs 20 are formed by MOCVD. Then, p-electrodes 7, 8 are formed by a lift-off method and after an n-electrode 9 is formed, a laser device having a resonator which is about 300 μm long is obtained by cleaving. The length of the electrode 8, that is, the independent current injection stripe, is 100 μm. When the p-$Ga_{0.55}Al_{0.45}As$ cladding layer 10 is from 0.05 to 0.6 μm thick, a refractive index distribution is obtained such as shown in FIG. 7d.

The device thus fabricated causes continuous oscillation at room temperature, a threshold current of 100 to 160 mA and a wavelength of 780 nm. First of all, the current is injected to the p-electrodes 7, 8 in order to inject the current to all the stripe regions. Then, its far-field pattern exhibits two emission beams (with the full width at half power of 1.5° for each beam) at +4.0° and −4.0°, and it is confirmed that the highest order supermode is selected. On the other hand, when the current is injected only to the p-electrode 7, its far-field pattern exhibits one emission beam at ±0° and the fundamental supermode is obtained. In other words, both modes can be selected in a satisfactory manner in the same way as in Embodiment 1 and the radiation angle of the emission beam can be made turnable to an optical output of up to 200 mW.

Figure 8A:
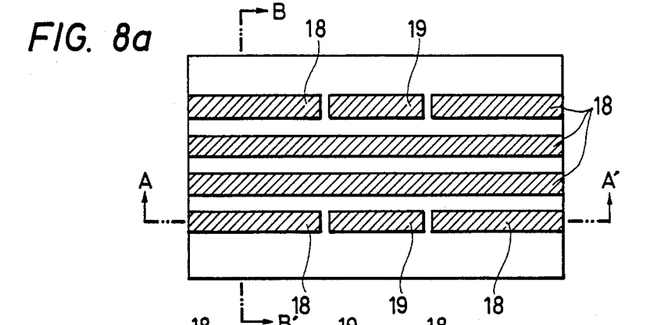
Figure 8B:
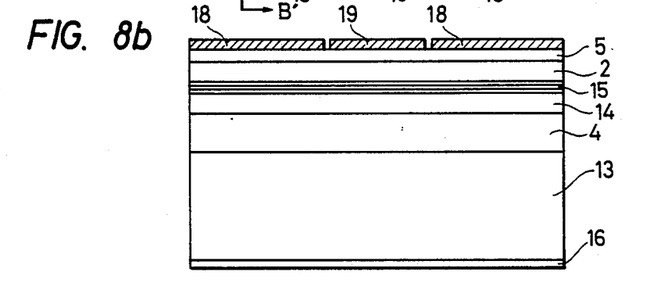
Figure 8C:
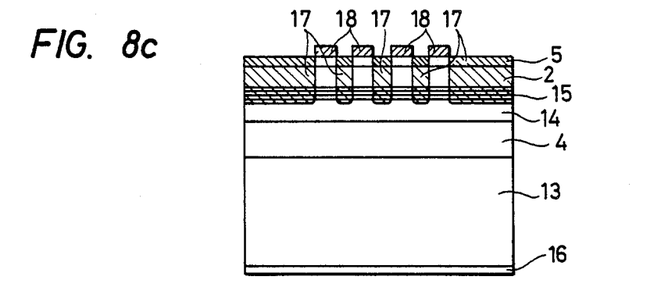
Figure 8D:
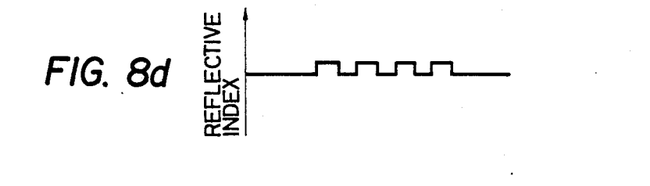

Embodiment 8:

FIGS. 8a through 8c show still anther embodiment of the present invention. FIG. 8a is a top view of a laser, FIG. 8b is a sectional view taken along line A—A' and FIG. 8c is a sectional view taken along line B—B' and FIG. 8d is a diagram showing a refractive index distribution of an active layer.

A p-$Ga_{0.5}Al_{0.5}As$ cladding layer 4, a p-$Ga_{0.55}Al_{0.45}As$ optical guide layer 14, a super lattice active layer 15 formed by alternately laminating five each 100 Å-thick undoped $Ga_{0.9}Al_{0.1}As$ well layers and 50 Å-thick undoped $Ga_{0.7}Al_{0.3}As$ barrier layers, and n-$Ga_{0.5}Al_{0.5}As$ cladding layer 2 and an n-GaAs cap layer 5 are sequentially formed on a p-GaAs substrate 13 by MOCVD. Then, Si ion is injected (17) into 3 μm-wide stripe regions and the outer region of the phased-array region so as to reach teh p-$Ga_{0.55}Al_{0.45}As$ optical guide layer 14, thereby forming four stripes. The space of the stripe center to center is 7 μm. Thereafter, n-side stripe electrodes 18, 19 are formed by a lift-off method and after a p-electrode 16 is formed, a laser device having a resonator which is about 300 μm long is obtained by cleaving.

The length of the electrode 19, that is, the length of the independent current injection stripe, is 100 μm. In this embodiment, the refractive index of the super lattice layer inside the Si ion injection region gets disordered and mixed. The refractive index of this disordered super lattice layer is smaller than that of the super lattice layer which is not disordered. As a result, when the n-$Ga_{0.55}Al_{0.45}As$ optical guide layer 14 is up to 0.5 μm thick, a refractive index distribution such as shown in FIG. 8d is obtained.

The device thus fabricated provides the same effect as that of Embodiments 6 and 7. In other words, when the current is injected to the n-electrodes 18, 19 in order to inject the current to all the stripe regions, the highest order supermode is selected and when the current is injected only to the n-electrode 18, the fundamental supermode is selected.

Incidentally, in Embodiments 6 through 8 of the present invention, the number of stripes is within the range of from 2 to 20.

Embodiment 9:

FIG. 9 is a sectional view of a laser device when the present invention is applied to a GaAlAs system semiconductor laser.

An n-$Ga_{0.5}Al_{0.5}As$ cladding layer 2, a multi-quantum well active layer 33 formed by alternately laminating six each of 8 nm-thick $Ga_{0.9}Al_{0.10}As$ well layers and 4 nm-thick $Ga_{0.70}Al_{0.30}As$ barrier layers, a p-$Ga_{0.5}Al_{0.5}As$ cladding layer 4 and an n-GaAs current blocking layer 5 are sequentially formed on an n-GaAs substrate crystal 1 by MOCVD. The n-GaAs layer 5 is removed completely by photoetching and three groove stripes which are 4 μm wide and expose the surface of the p-$Ga_{0.5}Al_{0.5}As$ cladding layer are formed. The gap of the stripes (the gap between the stripe center and the stripe center) is 6 μm.

Thereafter, proton (H+) ion is injected to regions outside the phased-array region to form a proton injection region 20. The proton ion injection is injected in this case so as to reach the n-GaAs current blocking layer 5 or the p-$Ga_{0.5}Al_{0.5}As$ cladding layer 6. The region into which the proton is injected becomes an insulating layer and no current injection occurs into this region. After the p-electrode 8 and an electrode 40 for applying a electric field are formed on the phased-array region and on the proton injection region 20, respectively, a laser device having a resonator which is about 300 μm long can be obtained. The p-$Ga_{0.5}Al_{0.5}As$ cladding layer 4 is from 0.1 to 0.5 μm thick and under this condition, the laser is of a refractive index type. There can thus be obtained a high output phased-array laser having low aberration.

The device thus fabricated causes continuous oscillation at room temperature, a threshold current of from 100 to 120 mA and a wavelength of 780 nm, and its oscillation spectrum exhibits a single longitudinal mode. When the voltage of the field application electrode 40 is zero, two emission beams (each having a full width at half power of 1.5°) are observed in the far-field pattern at +4.0° and −4.0° and it is confirmed that the highest order supermode is selected. On the other hand, when the voltage of the field application electrode 40 is +5 V, one emission beam (full width at half power of 1.5°) is observed in the far-field pattern at ±0° and the fundamental supermode oscillation is obtained.

It is confirmed from above that the fundamental mode is selected as the effective forbidden band width of the multi-quantum well layer 33 becomes small due to the application of the field and the loss of the laser beam becomes great. When a voltage +3 V is applied to the field application electrode 40, two emission beams having the full width at half power of 1.5° are observed at +1.5° and −1.5° and the mode is confirmed to be the secondary supermode. It is clarified that all of the three kinds of supermodes can be selected freely by changing the voltage to be applied to the field application electrode 40.

Figure 10:
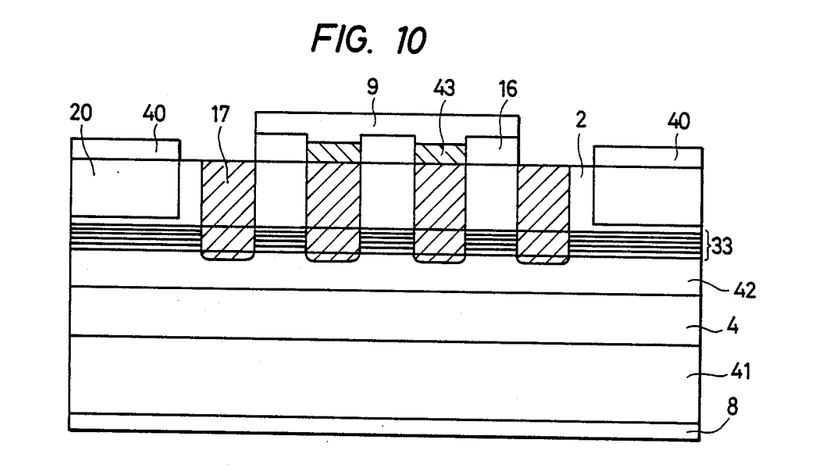
FIG. 10 is a sectional view of a further embodiment of the present invention.

Embodiment 10:

Still another embodiment of the present invention which is different from Embodiment 9 will be described with reference to FIG. 10. The drawing is a sectional view of a laser device.

A p-$Ga_{0.5}Al_{0.5}As$ cladding layer 4, a p-$Ga_{0.6}Al_{0.4}As$ optical guide layer 42, a multi-quantum well active layer 33 formed by alternately laminating five each of 70 Å-thick $Ga_{0.92}Al_{0.08}As$ well layers and 40 Å-thick $Ga_{0.72}Al_{0.28}As$ barrier layers, an n-$Ga_{0.5}Al_{0.5}As$ cladding layer 2 and an n-GaAs cap layer 16 are sequentially formed on a p-GaAs substrate 41 by MOCVD. After three n-GaAs cap layers 16 which are 5 μm-wide stirpes are left by photoetching, Si ion is injected into the rest of the regions so as to reach the active layer 33 and to form a layer 17 which is disordered and mixed. Here, the gap between the centers of the stripes is 8 μm. An $SiO_2$ film 43 is deposited onto the gap of the stripe-like n-GaAs cap layer, and a p-electrode 8 and an n-electrode 9 are formed. Thereafter, the proton ion is injected to the outer region of the phased-array region to form a proton injection region, and a field application electrode 40 is formed thereon. A laser device having a resonator which is about 300 μm long is then obtained by cleaving. The laser device thus fabricated exhibits the same effect as that of Embodiment 9, and the fundamental supermode and the highest order supermode can be selected independently by applying a voltage to the field application electrode 40.

As the stripe structure of each of the Embodiments of the present invention, any combination of the stripe number of from 2 to 20 and the stripe gap width of from 1 to 8 μm provides the same effect. A BH structure, a rib-type structure, and the like, can be applied as the fundamental stripe structure in the present invention besides the stripe structure described above.

Besides the wavelength of around 0.78 μm shown in each of the foregoing embodiments, the same effect can be obtained throughout all the ranges where a GaAlAs system semiconductor laser of a wavelength of 0.68 to 0.89 μm can oscillate continuously at room temperature. The semiconductor laser device in accordance with the present invention can be applied in the same way to laser materials other than the GaAlAs system such as an InGaAsP system and an InGaP system. Besides the laser structure based on the three-layer slab structure shown in each of the foregoing embodiments, the present invention can be applied similarly to an LOC structure where an optical guide layer is disposed adjacently on one side of the active layer, an SCH (separate confinement heterostructure) where the optical layers are disposed adjacently on both sides of the active layer and a GRIN-SCH (graded index separate confinement heterostructure) structure where the refractive index and forbidden band width of the optical guide layers are distributed in the direction of the thickness of the film.

In each of the foregoing embodiments, the same effect can be obtained when the conduction types are all changed to the opposite types (such as p to n and n to p).

In each of the foregoing embodiments of the present invention, the same effect can be obtained by a desired combination of the stripe number of from 2 to 20, the stripe width of from 1 to 10 μm and the stripe gap width of from 1 to 8 μm. Besides the stripe structure described above, a Bh structure, a rib-type structure, and the like, can of course be selected arbitrarily as the stripe fundamental structure of the present invention. Besides Zn, Si and S can provide the same effect as the diffusion impurity for isolation of electrodes of the adjacent stripe electrodes, and Ga, Al, F and B can provide substantially the same effect.

It will be obvious for those skilled in the art that the present invention can be applied to the structure of semiconductor lasers within the entire range in which they can oscialte continuously at room temperature.

What is claimed is:

1. A semiconductor laser device comprising:
   a semiconductor substrate having at least two grooves formed therein and having a gap between each two grooves;
   a plurality of semiconductor layers formed on said substrate over said grooves and said gap, including at least one semiconductor layer and an active layer, wherein said semiconductor layer is located between said substrate and said active layer;
   diffused regions formed in said plurality of layers, to a depth less than the active layer;
   a first electrode formed on said substrate opposite said plurality of layers; and
   a plurality of second electrodes formed on said diffused regions,
   wherein a radiation angle of a laser emission beam generated by said semiconductor laser device is turnable by controlling current injection quantities into said second electrodes.

2. A semiconductor laser device as defined in claim 1, wherein said diffused regions correspond to each of said grooves and each of said gaps, and said diffused regions have a diffusion width less than the widths of said grooves and gaps, respectively.

3. A semiconductor laser device as defined in claim 2, wherein the radiation angle is turnable by alternately injecting currnet into only said second electrode formed on said diffusion regions corresponding to said grooves so that the laser is in a high order supermode, and then injecting current into only said second electrodes formed on said diffusion regions corresponding to said gaps so that the laser is in a fundamental supermode.

4. A semiconductor laser device as defined in claim 2, wherein said diffused regions have a width less than widths of said grooves and said gaps, respectively.

5. A semiconductor laser device as defined in claim 1, wherein said diffusion regions correspond to said grooves, and preselected second electrodes are divided into a plurality of sections.

6. A semiconductor laser device as defined in claim 5, wherein the radiation angle is tunable by alternately injecting current into only said second electrode that are not divided and end sections of said preselected second electrodes so that the laser is in a fundamental supermode, and injecting current into all sections of said second electrodes so that the laser is in a high order supermode.

7. A semiconductor laser device comprising:
a semiconductor substrate;
a plurality of semiconductor layers including an active layer and a stripe layer having at least two stripes, wherein said active layer is located between said substrate and said stripe layer;
a first electrode formed on said substrate opposite said plurality of layers; and
a plurality of second electrodes formed on an uppermost layer of said plurality of layers,
wherein a radiation angle of a laser emission beam generated by said semiconductor laser device is tunable by controlling current injection quantities into said second electrodes.

8. A semiconductor laser device as defined in claim 7, further comprising a plurality of diffused regions formed to be a depth less than said active layer in said plurality of layers corresponding to each of said stripes and to gaps between said stripes, and wherein said second electrodes are formed on said diffused regions.

9. A semiconductor laser device as defined in claim 8, wherein said diffused regions have a width less than widths of said stripes and said gaps, respectively.

10. A semiconductor laser device as defined in claim 8, wherein the radiation angle is tunable by alternately injecting current into only said second electrodes formed on said diffused regions corresponding to said stripes so that the laser is in a fundamental supermode, and injecting current into only said second electrodes formed on said diffused regions corresponding to said gaps so that the laser is in a high order supermode.

11. A semiconductor laser device as defined in claim 7, wherein said second electrodes are formed so as to correspond with said gaps, and wherein preselected second electrodes are divided into a plurality of sections.

12. A semiconductor laser device as defined in claim 11, wherein the radiation angle is tunable by alternately injecting current only into said second electrodes which are not divided and into end sections of said preselected second electrodes so that the laser is in a fundamental supermode, and injecting current into all sections of said second electrodes so that the laser is in a high order supermode.

13. A semiconductor laser device comprising:
a semiconductor substrate;
a plurality of semiconductor layers formed on said semiconductor substrate including an active layer, an optical guide layer and a superlattice layer wherein said active layer is located nearest said substrate and said optical guide layer is located between said active layer and said superlattice layer, at least two stripe regions formed in said plurality of layers;
a first electrode formed on said substrate opposite said plurality of layers; and
a plurality of second electrodes formed on an uppermost layer of said plurality of layers,
wherein a radiation angle of a laser emission beam generated by said semiconductor laser device is tunable by controlling current injection quantities into said second electrodes.

14. A semiconductor laser device as defined in claim 13, further comprising insulation layers formed on both sides of said stripe regions, wherein said second electrodes are formed on each said stripe region and on gaps between said stripe regions.

15. A semiconductor laser device as defined in claim 14, wherein said radiation angle is tunable by alternately injecting current into only said second electrodes formed on said stripe regions so that the laser is in a high order supermode, and injecting current into only said second electrodes formed on said gaps so that the laser is in a fundamental supermode.

16. A semiconductor laser device as defined in claim 13, wherein said second electrodes are formed on gaps between said stripe regions, and preselected second electrodes are divided into a plurality of sections.

17. A semiconductor laser device as defined in claim 16, wherein the radiation angle is tunable by alternately injecting current only into said second electrodes which are not divided and into end sections of said preselected second electrodes so that the laser is in a fundamental supermode, and injecting current into all sections of said second electrodes so that the laser is in a high order supermode.

18. A semiconductor laser device comprising:
a semiconductor substrate;
a plurality of semiconductor layers formed on said substrate including a multi-quantum well active layer, and at least two stripes of a current blocking layer, wherein said active layer is located between said substrate and said current blocking layer;
proton injection regions formed in said plurality of layers to a depth less than said active layer;
a first electrode formed on said substrate opposite said plurality of layers;
second electrodes formed on said portion injection regions; and
a third electrode formed on an uppermost layer of said plurality of layers,
wherein a radiation angle of a laser emission beam generated by said semiconductor laser device is tunable by applying different voltages to said second electrodes.

19. A semiconductor laser device comprising:
a semiconductor substrate;
a plurality of semiconductor layers including a multi-quantum well active layer and an optical guide layer, wherein said optical guide layer is located between said substrate and said active layer;
at least two stripe regions formed in said plurality of layers to a depth less than said active layer;
proton injection regions formed in said plurality of layers;
a first electrode formed on said substrate opposite said plurality of layers;
a second electrode formed in preselected stripe regions; and
third electrodes formed on said proton injection regions,
wherein a radiation angle of a laser emission beam generated by said semiconductor laser device is tunable by applying different voltages to said third electrodes.

20. A semiconductor laser device as defined in any of claims 1, 7, 13, 18 or 19, wherein the semiconductor substrate and plurality of layers comprise a GaAlAs system, and InGaAsP system or an InGaP system.

21. A semiconductor laser device as defined in any of claims 18 or 19, wherein said multi-quantum well active layer has a thickness below a de Broglie wavelength of an electron.

22. A semiconductor laser device comprising:
a semiconductor substrate;
a plurality of semiconductor layers formed on the semiconductor substrate, including an active layer and at least one semiconductor layer, said semiconductor layer being located between said substrate and said active layer and also including a periodic distribution of refractive index formed near or at the active layer;
a first electrode formed on the semiconductor substrate opposite the plurality of semiconductor layers; and
a plurality of second electrodes formed on an uppermost layer of the plurality of layers, corresponding to a plurality of regions of the periodic distribution of refractive index,
wherein a radiation angle of a laser emission beam generated by the semiconductor laser device is tunable by controlling current injection quantities into said second electrodes.

* * * * *